(12) United States Patent
Atkinson

(10) Patent No.: US 10,234,916 B2
(45) Date of Patent: Mar. 19, 2019

(54) DISSIPATING HEAT WITHIN HOUSINGS FOR ELECTRICAL COMPONENTS

(71) Applicant: HEWLETT-PACKARD DEVELOPMENT COMPANY, L.P., Houston, TX (US)

(72) Inventor: Lee Warren Atkinson, Taipei (TW)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 266 days.

(21) Appl. No.: 15/206,826

(22) Filed: Jul. 11, 2016

(65) Prior Publication Data

US 2016/0320815 A1 Nov. 3, 2016

Related U.S. Application Data

(63) Continuation of application No. 14/041,526, filed on Sep. 30, 2013, now Pat. No. 9,426,930, which is a continuation of application No. 12/996,764, filed as application No. PCT/US2008/068519 on Jun. 27, 2008, now Pat. No. 8,564,943.

(51) Int. Cl.
*G06F 1/20* (2006.01)
*H05K 7/20* (2006.01)

(52) U.S. Cl.
CPC ......... *G06F 1/203* (2013.01); *H05K 7/20436* (2013.01); *H05K 7/20518* (2013.01)

(58) Field of Classification Search
CPC ............... G06F 1/203; H05K 7/20436; H05K 7/20518; H05K 7/20472–7/20481
USPC ................................................ 361/705, 713
See application file for complete search history.

(56) References Cited

U.S. PATENT DOCUMENTS

| 4,980,848 | A | 12/1990 | Griffin et al. |
| 5,757,615 | A | 5/1998 | Donahoe et al. |
| 5,910,883 | A | 6/1999 | Cipolla |
| 5,982,617 | A | 11/1999 | Haley |
| 6,181,555 | B1 | 1/2001 | Haley |
| 6,347,035 | B1 | 2/2002 | Hamano et al. |

(Continued)

FOREIGN PATENT DOCUMENTS

| JP | 2006203018 | 8/2006 |
| WO | WO-03048912 | 6/2003 |
| WO | WO-2005122663 | 12/2005 |

OTHER PUBLICATIONS

DE Office Action, Appln No. 112008003920.8, dated Jul. 7, 2011, 10 pages.

(Continued)

*Primary Examiner* — Anthony M Haughton
*Assistant Examiner* — Yahya Ahmad
(74) *Attorney, Agent, or Firm* — HPI Patent Department

(57) ABSTRACT

In some examples, an apparatus includes a housing comprising an inner surface provided with thermal members, and a thermal attachment to transfer heat generated by a heat producing component to the housing. The thermal attachment is thermally contacted with the inner surface of the housing, and the thermal members are arranged to steer heat from the heat producing component and transferred to the housing by the thermal attachment at a greater heat flow rate through the housing to a first region of the housing and at a lesser heat flow rate through the housing to a second region of the housing.

14 Claims, 7 Drawing Sheets

(56) References Cited

U.S. PATENT DOCUMENTS

| | | | |
|---|---|---|---|
| 7,044,201 B2 | 5/2006 | Cho et al. | |
| 7,330,354 B2* | 2/2008 | Watanabe | G06F 1/203 |
| | | | 174/252 |
| 7,995,344 B2* | 8/2011 | Dando, III | H05K 7/20454 |
| | | | 165/104.33 |
| 2001/0046119 A1* | 11/2001 | Hamano | G06F 1/1616 |
| | | | 361/679.54 |
| 2004/0159935 A1* | 8/2004 | Ghosh | H01L 23/34 |
| | | | 257/712 |
| 2005/0150649 A1* | 7/2005 | Tsukamoto | F28F 3/022 |
| | | | 165/185 |
| 2005/0155755 A1 | 7/2005 | Matsuda et al. | |
| 2005/0199367 A1* | 9/2005 | Romahn | H01L 23/36 |
| | | | 165/80.3 |
| 2005/0241817 A1* | 11/2005 | Moore | H01L 23/36 |
| | | | 165/185 |
| 2007/0047209 A1* | 3/2007 | Thompson | H01L 23/433 |
| | | | 361/710 |
| 2007/0102142 A1* | 5/2007 | Reis | H01L 23/3677 |
| | | | 165/80.3 |
| 2007/0227704 A1 | 10/2007 | Nagai et al. | |
| 2013/0092584 A1 | 4/2013 | Sheehy et al. | |
| 2013/0312749 A1 | 11/2013 | Bornn et al. | |

OTHER PUBLICATIONS

The International Search Report and the Written Opinion of the International Searching Authority for International Application No. PCT/US2008/068519 dated Feb. 25, 2009, 11 pages.

Translation of DE Office Action, Appln No. 112008003920.8, dated Jul. 7, 2011, 3 pages.

UK Intellectual Property Office, Examination Report under Section 18(3), Application No. GB1019279.7, dated Jan. 20, 2012, 5 pages.

UK Intellectual Property Office, Examination Report under Section 18(3), Appln No. GB1019279.7, dated Jun. 12, 2012, 4 pages.

UK Intellectual Property Office, Examination Report under Section 18(3), Appln No. GB1019279.7, dated Oct. 31, 2012, 4 pages.

* cited by examiner

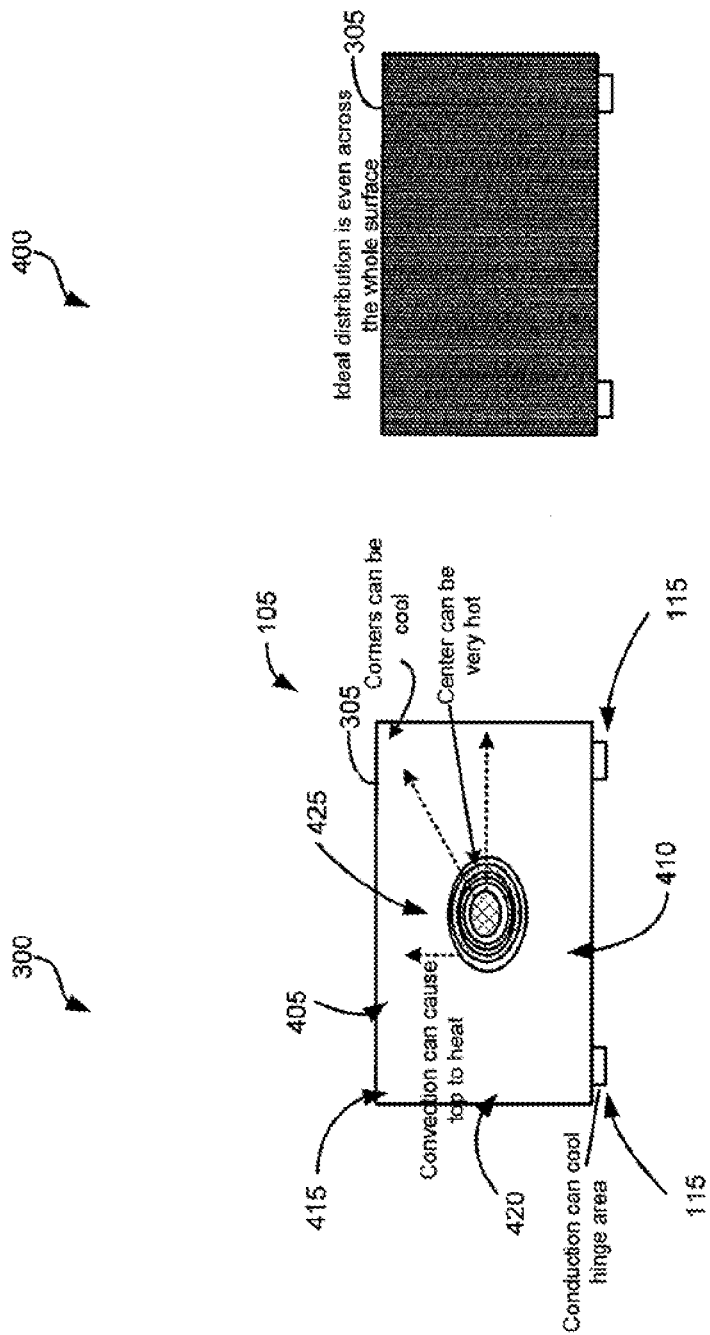

DISSIPATING HEAT WITHIN HOUSINGS FOR ELECTRICAL COMPONENTS

CROSS REFERENCE TO RELATED APPLICATIONS

This is a continuation of U.S. application Ser. No. 14/041,526, filed Sep. 30, 2013, which is a continuation of U.S. application Ser. No. 12/996,764, filed Dec. 7, 2010, now U.S. Pat. No. 8,564,943, which is a national stage application under 35 U.S.C. § 371 of PCT/US2008/068519, filed Jun. 27, 2008, which are hereby incorporated by reference in their entirety.

BACKGROUND

Conventional clamshell computer systems place a video controller and central processing unit (CPU) nearby in the base. The display refresh signals connect to a display housing. Heat generated by the video controller is dissipated in the base of the clamshell computer, with the heat dissipated in the display housing. The base of the clamshell computer is typically designed and constructed to connect and dissipate the heat from the combination of CPU and video controller.

Liquid cooling systems have sought to take advantage of the large passive area of the display rear enclosure to dissipate heat. Those systems transfer heat from the base through the hinge cavity (using thermally conductive material, including water) and then radiate the heat passively across the surface of the display housing. However, the space that is used for the video graphics adapter (VGA) controller circuitry and its thermal evacuation may be substantial, increasing the size of the base of the clamshell computer. Typically, a small or thin base size is attractive to a user. In addition, thermal evacuation on the base places the heat on the lap of a user and the fans used to remove the heat make noise which may be unattractive.

SUMMARY

Embodiments of various electrical housings, particularly display housings, are provided. In this regard, a representative housing, among others, includes one or more electrical components that are disposed at the housing; a thermal attachment that is designed to transfer heat generated by the one or more electrical components; and a rear enclosure that is designed to engage the thermal attachment. The rear enclosure is further designed to receive and dissipate the received heat from the thermal attachment.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 4 illustrates a hot spot on a top housing of a clamshell computer, such as that shown in FIG. 1.

FIG. 5 illustrates an ideal heat distribution across a rear enclosure of a clamshell computer, such as that shown in FIG. 4.

DETAILED DESCRIPTION

Exemplary systems are first discussed with reference to the figures. Although these systems are described in detail, they are provided for purposes of illustration only and various modifications are feasible.

Figure 1:
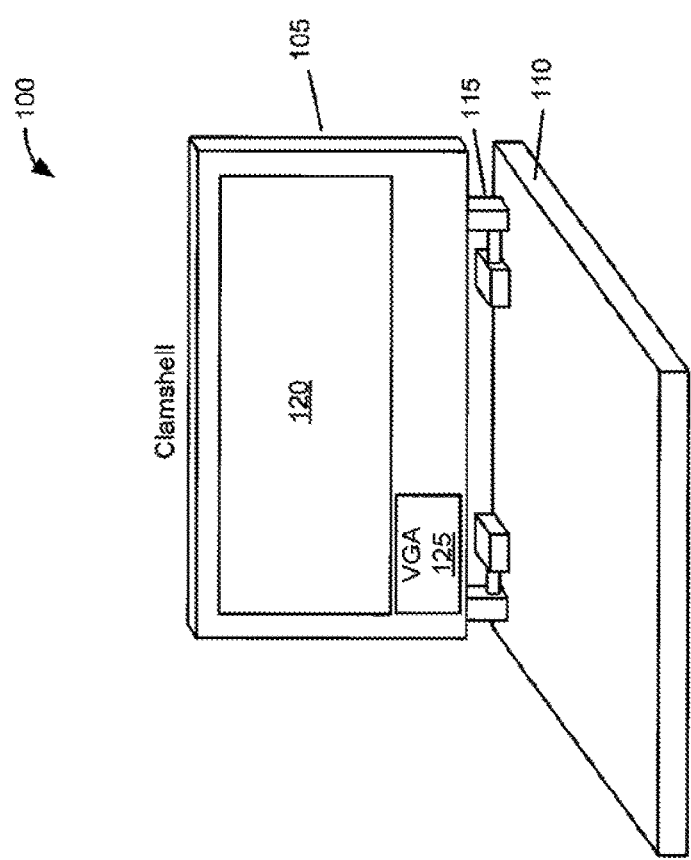
FIG. 1 is a perspective view of an embodiment of a clamshell computer.

FIG. 1 is a perspective view of an embodiment of a clamshell computer 100. The clamshell computer 100 generally has two (2) pieces, e.g., a top housing 105 and a base 110, joined by a hinge 115. The top housing 105 includes a display device 120, and the base 110 includes a central processing unit (CPU), battery, hard drive, etc. (not shown). Cables (not shown) communicate display data and power from the base 110 to the top housing 105. The video graphics adapter (VGA) controller 125 is generally located in the top housing 105.

It should be noted that a clamshell computer is generally different from an "all in one" computer, where electrical functions are located together in the top housing. Typical examples of an "all in one" are the Sony W101, the Apple iMac, and tablet computers (also known as "slate"). In this disclosure, the clamshell computer has some software computation performed at the base 110. It is possible that the method and system of dissipating heat described in this disclosure can be utilized in the "all in one" computer.

Figure 2:
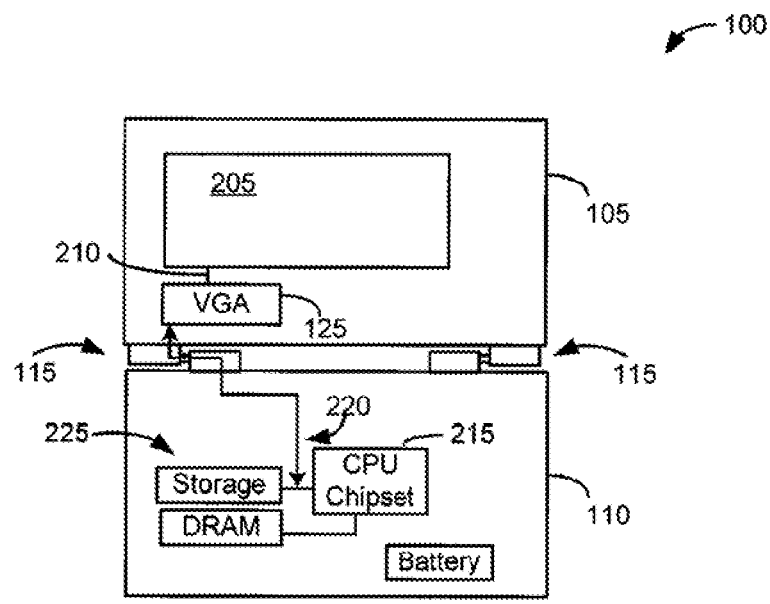
FIG. 2 is a schematic view of a clamshell computer, such as that shown in FIG. 1.

FIG. 2 is a schematic view of the clamshell computer 100, such as that shown in FIG. 1. The top housing 105 includes a liquid crystal display (LCD) 205 that is electrically coupled to the VGA controller 125 via, for example, a low-voltage differential signaling (LVDS) link or a DisplayPort 210. The display 205 generally has no memory; the display link or port 210 can be a unidirectional bus carrying data to the LCD 205. The VGA controller 125 is generally electrically coupled to a CPU 215 and main memory 225 via, for example, a peripheral component interconnect express (PCI-E) bus 220. The VGA controller 125 is an engine that creates a visual page from a CPU instruction.

A memory or a frame buffer (not shown) is located near the VGA controller 125. The frame buffer holds the constructed image. The process of writing to the display 205 involves the VGA controller 125 repeatedly accessing the frame buffer data, pixel by pixel, then line by line, and transferring to the display 205. The speed of the data across the link or port 210 is a function of the color depth of the display 205, the display resolution, and the refresh rate of the image.

With electrical components in the top housing 105, heat can be created in the top housing 105 directly and dissipated there from the base 115. The heat can spread to the top surface of the top housing 105 so as to avoid a "hot spot" on the rear of the top housing 105 that would be uncomfortable to a touch of the user.

Figure 3:
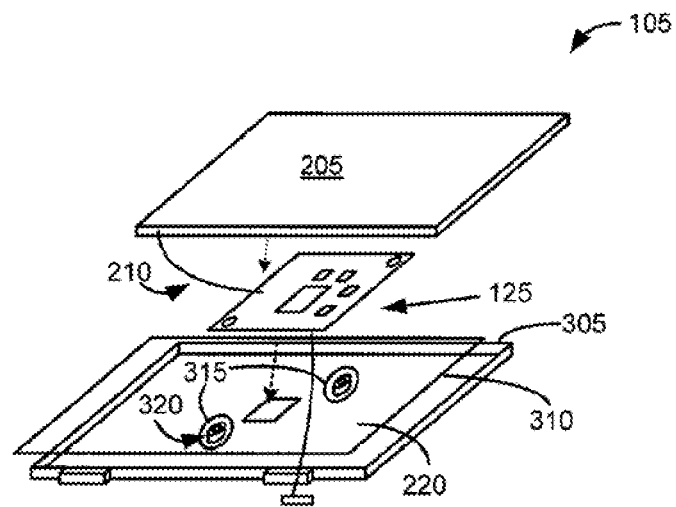
FIG. 3 is a preassembled view of a top housing of a clamshell computer, such as that shown in FIG. 1, having a thermal attachment.

FIG. 3 is a preassembled view of a top housing of a clamshell computer, such as that shown in FIG. 1, having a thermal attachment. The top housing 105 includes the VGA controller 125 that is disposed between the LCD 205 and a thermal attachment 310. The VGA controller 125 is placed on a separate printed circuit board (PCB) and is mounted on a top surface of a rear enclosure 305 via PCB fasteners 320. The thermal attachment 310 includes holes 315 that register with the PCB fasteners 320. Alternatively or additionally, the VGA controller 125 may be located along with the LCD display 205 itself. The thermal attachment 310 is disposed between the VGA controller 125 and the rear enclosure 305, so heat is transferred from the VGA controller to the rear enclosure 305, where heat meets cooler ambient air. The thermal attachment 310 covers a portion of the inner surface area of the rear enclosure 305. The thermal attachment 310 is further described in relation to FIGS. 5-7.

FIG. 4 illustrates a hot spot on a top housing of a clamshell computer 100, such as that shown in FIG. 1. Attaching a heat source, e.g., VGA controller 125, to a single point has potential limitations. The thermal resistance of many materials is linearly proportional to its thickness. The top housing 105 is generally thin (approximately one (1) or two (2) millimeters thick) and wide such that the thermal resistance in the X and Y direction is relatively higher than in the Z direction. Accordingly, attachment of a heat source to the rear enclosure 305 can create a localized hot spot 425 on the opposite side of the rear enclosure 305. The amount of power dissipated can be limited by the maximum temperature allowed on the user-touchable surface of the rear enclosure 305. This can limit the graphics performance of the clamshell computer 100, since graphics performance of the clamshell computer 100 is proportional to the amount of power that the clamshell computer 100 consumes.

Heat convection generally favors heat traveling upward towards a top edge 405 of the top housing 105, making the bottom edge 410 of the top housing 105 cooler. Also, the conduction of heat via the hinges 115 ensures that the bottom edge 410 of the rear enclosure 305 is cooler than the top edge 405. Since thermal resistance is linear to dimension, the corners 415 of the clamshell computer 100 are generally cooler than the middle edges 420 of the rear enclosure 305. The combination of these forces generally means that a "hot spot" 425 is created. Eliminating the hot spot 425 (and dissipating the heat more evenly over the broadest possible surface area) is a challenge that is addressed in this disclosure. FIG. 5 illustrates an ideal distribution across the rear enclosure 305, in which heat is distributed evenly across the whole surface of the rear enclosure 305.

Figure 6:
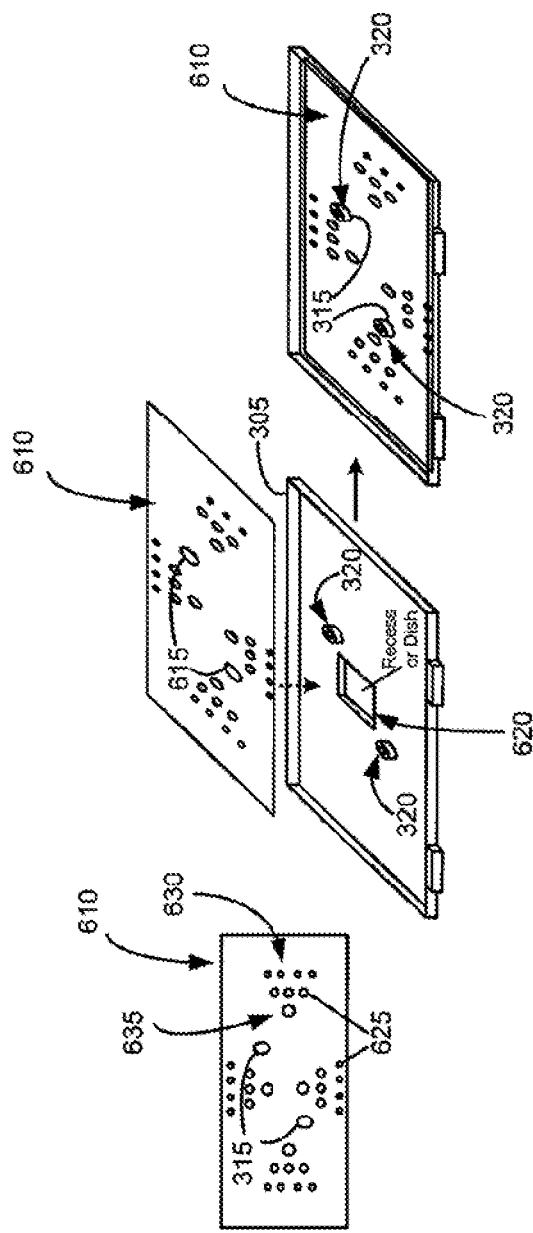
FIG. 6 is a perspective view of an embodiment of a thermal attachment, such as that shown in FIG. 3.

FIG. 6 is a perspective view of an embodiment of a thermal attachment 610, such as that shown in FIG. 3. The thermal attachment 610 can be made of graphite material that is capable of distributing temperature; whereas, most material (plastic, air, metal) is generally thermally conductive no matter the orientation. In addition, graphite can be formed into sheets that are highly conductive in a plane and moderately conductive in other directions. For example, a graphite sheet may be highly conductive (1000 W/mK) in the flat X-Y direction, but moderately conductive (50 W/mK) in the thin Z direction. So, graphite can be used to "steer" heat, especially for the purpose of decreasing touch temperature and dissipating the hot spot 425 (FIG. 4) by spreading the heat uniformly among a broad surface, generally before conducting to the surface of the rear enclosure 305.

However, using a graphite sheet has some disadvantages. For example, the graphite sheet is not of uniform temperature. Though the graphite is highly thermally conductive, the longer distances, especially the corners, are generally cooler. Also, thermal conductivity depends on the thickness of the material, and it may be attractive to maintain a thin display enclosure. In addition, the contact point where the VGA controller 125 attaches to the graphite sheet can be the hottest location. Further, conduction in the Z plane may be lower than optimal, to transfer heat to the enclosure rear surface.

Thermal conductivity of the graphite sheet can be controlled by a pattern of perforations 625. In this example, heat is steered toward the corners by introducing perforation patterns 625 in the area of the highest heat flow. The perforations patterns 625 are designed and arranged in a triangular shape, where the bases 630 of the perforated triangles 625 are adjacent to the side edges of the thermal attachment 610 and the top corners 635 of the perforated triangles 625 are pointing toward the center of the thermal attachment 610. Alternatively or additionally, the perforated patterns can have other geometric shapes, such as, diamond, square, heptagon, and other polygonal shapes.

The perforations 625 at the top corners 635 of the perforated triangles are larger than the perforations 625 at the bases 630. The size of the perforations gradually increases from the base 630 to the top corner 635. The perforations 635 can cause interruptions of the thermal conduction. In this case, a heat source located in the middle of the top housing 105 can promote heat flow to the cooler corners of the top housing 105.

The contact area of the VGA controller 125 to the thermal attachment 610 can be the highest temperature point. The rest of the rear enclosure 305 can be highly conductive if the rear enclosure 305 is made of magnesium or aluminum and not plastic. The enclosure area opposite the contact area is isolated from the hot spot 425 by any of the following methods, among others:

a. the center of the rear enclosure 305 is recessed or dished 620 (so as not to make contact with the graphite sheet).
b. an insulative material (not shown), e.g. a poor thermal conductor such as rubber foam, is positioned between the thermal attachment 610 and the rear enclosure 305.
c. a decoration (not shown) made of relatively poorly conducting material is placed on the outside of the rear enclosure 305. The decoration can include the clamshell computer logo.

Figure 7:
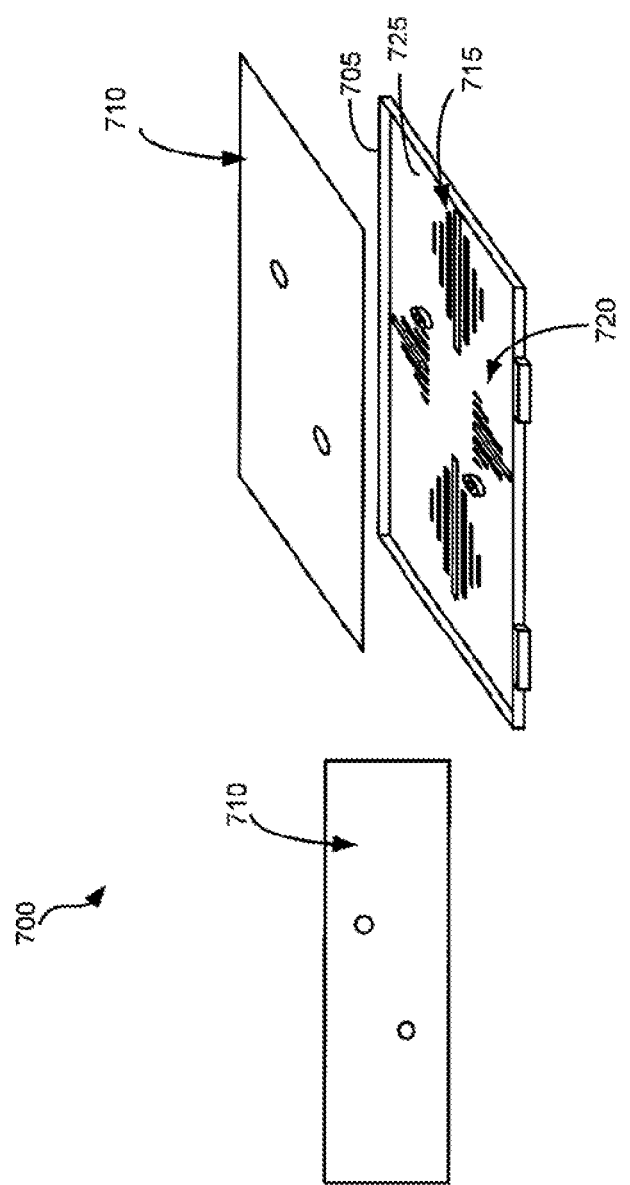
FIG. 7 is a perspective view of another embodiment of a thermal attachment and a rear enclosure, such as that shown in FIG. 3, that include isolating members that thermally isolate the thermal attachment from the rear enclosure.

FIG. 7 is a perspective view of another embodiment of a thermal attachment 710 and a rear enclosure 705, such as that shown in FIG. 3, that include isolating members that thermally isolate the thermal attachment 710 from the rear enclosure 705. The isolating members 715, 720 facilitate controlling contacts between the thermal attachment 710 and the rear enclosure 705. The isolating member 715, 720 can be recesses 715, 720 which thermally isolate the thermal attachment 710. The recesses 715, 720 could be formed on the inner surface 725 of the rear enclosure 705.

A patterned conductive sheet (not shown) could be applied in between the thermal attachment 710 and rear enclosure 705. Lastly, thermally conductive adhesive could be applied to control the conduction of heat from the thermal attachment 710 to the rear enclosure 705. In this example, the isolating member 715 includes multiple parallel recesses in a diamond shape and the isolating member 720 includes multiple parallel recesses in a triangular shape, both having a corner pointing towards the side edge of the rear enclosure 705. However, the isolating member 715 can have other geometric shapes, such as, square, heptagon, and other polygonal shapes FIG. 8 includes a preassembled view and a cross-sectional view of another embodiment of a thermal attachment 810 and rear enclosure 805, such as that shown in FIG. 3, that decrease thermal resistance to the rear enclosure 805. The rear enclosure 805 has a pattern of thermal ridges 820 disposed on the inner surface 825 of the rear enclosure 805. The thermal attachment 810 has a complementary pattern of slots 815 that registers with the pattern of thermal ridges 820. In this example, two sets of patterned thermal ridges 820 are disposed at the top left corner and bottom right corner of the rear enclosure 805. Each pattern of thermal ridges 820 includes three separate and elongated ridges. A middle ridge is positioned diagonally from the corner of the rear enclosure 805 towards the center of the rear enclosure 805. Left and right ridges are placed substantially parallel to the middle ridge.

Figure 9:
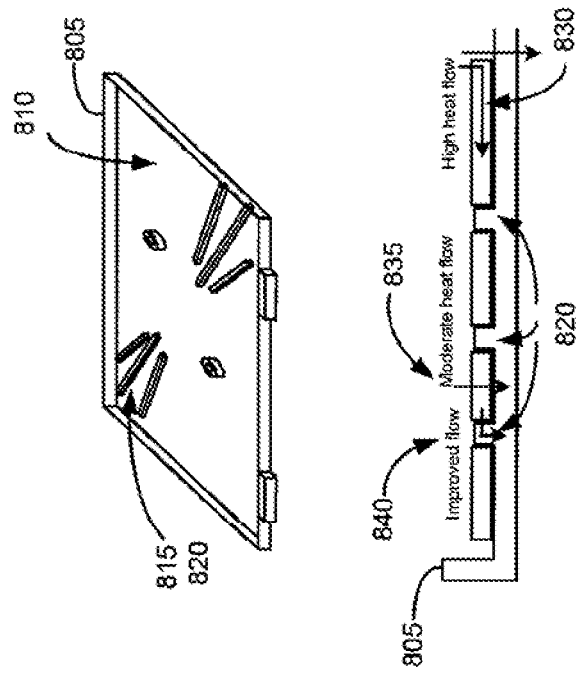
FIG. 9 includes an assembled view and a cross-sectional view of another embodiment of the thermal attachment and rear enclosure, such as that shown in FIG. 8.
Figure 8:
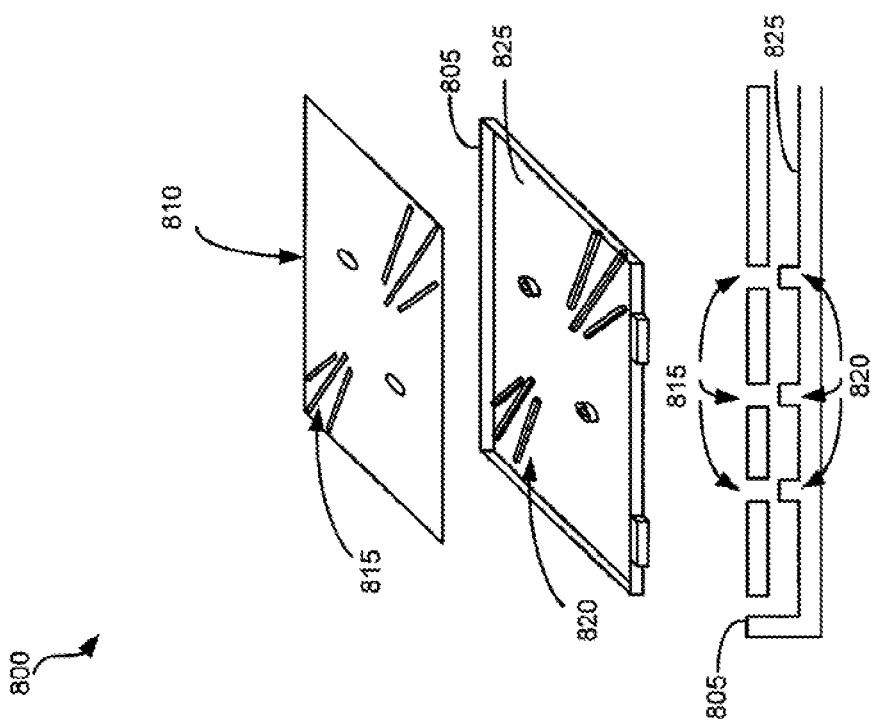
FIG. 8 includes a preassembled view and a cross-sectional view of another embodiment of a thermal attachment and rear enclosure, such as that shown in FIG. 3, that decrease thermal resistance to the rear enclosure.

FIG. 9 includes an assembled view and a cross-sectional view of another embodiment of a thermal attachment 810 and rear enclosure 805, such as that shown in FIG. 8. It should be noted that tight contact is generally made between the thermal attachment 810 and the rear enclosure 805 via the slots 815 and the thermal ridges 820. To avoid air gaps, a conductive paste or epoxy (not shown) may be used to fill the gap between the thermal attachment 810 and the rear enclosure 805. The conduction of heat in the Z direction may be limited, so that the temperature of the rear enclosure 805 is cool to the touch even when the VGA controller 125 (FIG. 1) is hot. The thermal attachment 810 conducts heat generated within the top housing 105 (FIG. 1) and intersperses thermal contacts to the X/Y plane of the thermal attachment 810. Heat flow within the thermal attachment 810 can travel towards the thermal ridges 820 and slots 815 as indicated with arrow 830. The thermal ridges 820 act as channels for heat to flow to the outside of the rear enclosure 805 as indicated with arrow 840. These are positioned in areas where heat should be steered normally towards the cooler areas, such as the corners. In addition, heat flow can travel from the thermal attachment 810 to the inner surface 825 of the rear enclosure 805 as indicated with arrow 835. It should be noted that the heat flow 840 is generally higher as compared to the heat flow 835.

Figure 10:
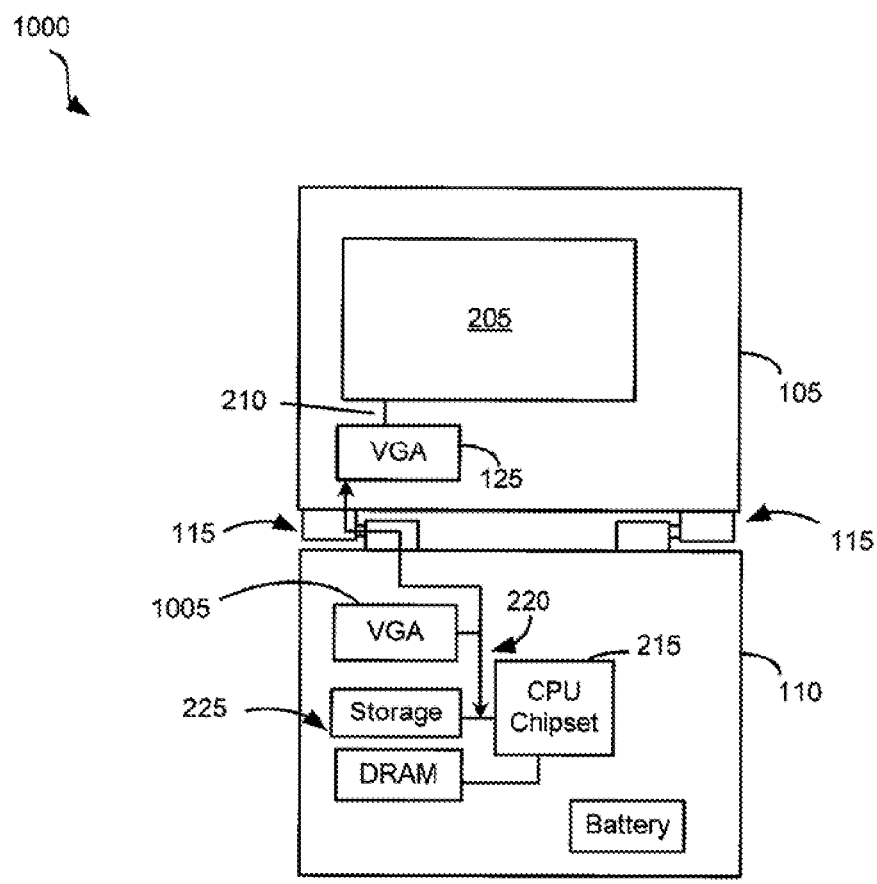
FIG. 10 is a schematic view of another embodiment of a clamshell computer, such as that shown in FIG. 1.

FIG. 10 is a schematic view of another embodiment of a clamshell computer, such as that shown in FIG. 1, and is denoted generally by reference number 1000. The design and architecture of the clamshell computer 1000 is similar to the clamshell 100 (FIG. 2), which includes top housing 105, LCD 205, hinge 115, base 110, first VGA controller 125, CPU 215, main memory 225, and link/port 210. However, the clamshell computer 1000 further includes a second VGA controller 1005 at the base 110. It is possible to have multiple VGA controllers in a computing system. For clamshell computers, a particular solution is called Hybrid™, SLI™ or CrossFire™. Physically distinct video controllers may be used together or individually to render 3D graphics. It may still be desirable to position the first VGA controllers at the top housing 105 and the second VGA controller 1005 at the base 110. In any computing system designs, the thermal attachment and the rear enclosure mentioned can be used to dissipate heat generated at the top housing.

This description has been presented for purposes of illustration and description. It is not intended to be exhaustive or to limit the disclosure to the precise forms disclosed. Obvious modifications or variations are possible in light of the above teachings. The embodiments discussed, however, were chosen to illustrate the principles of the disclosure, and its practical application. The disclosure is thus intended to enable one of ordinary skill in the art to use the disclosure, in various embodiments and with various modifications, as is suited to the particular use contemplated. All such modifications and variation are within the scope of this disclosure, as determined by the appended claims when interpreted in accordance with the breadth to which they are fairly and legally entitled.

What is claimed:

1. An electronic device comprising:
a housing comprising an inner surface provided with thermal members, wherein the thermal members comprise thermally conductive ridges that rise above the inner surface of the housing;
a heat producing component disposed in the housing; and
a thermal attachment to transfer heat generated by the heat producing component, wherein the thermal attachment comprises slots to receive the thermally conductive ridges,
wherein the thermal attachment is thermally contacted with the inner surface of the housing, the thermal members arranged to steer heat that is from the heat producing component and that is transferred to the housing by the thermal attachment at a greater heat flow rate through the housing to a first region of the housing and at a lesser heat flow rate through the housing to a second region of the housing.

2. The electronic device of claim 1, wherein the thermally conductive ridges comprise a plurality of groups of the thermally conductive ridges positioned at different locations on the inner surface of the housing, wherein heat transfer occurs at the greater heat flow rate through the plurality of groups of the thermally conductive ridges.

3. The electronic device of claim 1, wherein the thermal members further comprise recesses formed into the inner surface of the housing, the recesses to thermally isolate the thermal attachment from the housing in areas corresponding to the recesses.

4. The electronic device of claim 1, wherein the thermally conductive ridges extend from an area of the thermal attachment proximate the heat producing component to the first region.

5. The electronic device of claim 1, wherein the thermal attachment has a contact area on a first surface of the thermal attachment, the heat producing component thermally contacted to the contact area, and wherein a corresponding area on a second surface of the thermal attachment opposite the first surface is thermally insulated from the housing, the corresponding area on the second surface aligned with the contact area on the first surface.

6. The electronic device of claim 5, wherein the corresponding area is thermally insulated from the housing by a recess formed in the inner surface of the housing.

7. The electronic device of claim 5, wherein the corresponding area is thermally insulated from the housing by a thermally insulating layer between the corresponding area on the second surface of the thermal attachment and the inner surface of the housing.

8. The electronic device of claim 1, wherein the thermal attachment comprises a sheet of a thermally conductive material.

9. The electronic device of claim 8, wherein the thermally conductive material comprises graphite.

10. An apparatus comprising:
an outer housing comprising an inner surface provided with thermal members, wherein the thermal members comprise thermally conductive ridges that rise from the inner surface of the outer housing; and
a thermal attachment to transfer heat generated by a heat producing component to the outer housing, wherein the thermal attachment comprises slots to receive the thermally conductive ridges, and wherein the thermal attachment is thermally contacted with the inner surface of the outer housing, the thermal members arranged to steer heat that is from the heat producing component and that is transferred to the outer housing by the thermal attachment at a greater heat flow rate through the outer housing to a first region of the outer housing and at a lesser heat flow rate through the outer housing to a second region of the outer housing.

11. The apparatus of claim 10, wherein the thermally conductive ridges comprise a plurality of groups of the thermally conductive ridges positioned at different locations on the inner surface of the outer housing, wherein heat transfer occur at the greater heat flow rate through the plurality of groups of the thermally conductive ridges.

12. The apparatus of claim 10, wherein the thermal members further comprise recesses formed into the inner surface of the outer housing, the recesses to thermally isolate the thermal attachment from the outer housing in areas corresponding to the recesses.

13. A method comprising:
thermally contacting an electronic component within a housing to a thermal attachment; and
arranging thermal members in an inner surface of the housing, the inner surface thermally contacted to the thermal attachment, wherein the thermal members comprise thermally conductive ridges that rise from the inner surface of the housing, and wherein the thermal attachment comprises slots to receive the thermally conductive ridges, and the thermal members are arranged to steer heat that is from the electronic component and that is transferred to the housing by the thermal attachment at a greater heat flow rate through the housing to a first region of the housing and at a lesser heat flow rate through the housing to a second region of the housing.

14. The method of claim 13, wherein the thermal attachment has a contact area on a first surface of the thermal attachment, the electronic component thermally contacted to the contact area, and wherein a corresponding area on a second surface of the thermal attachment opposite the first surface is thermally insulated from the housing, the corresponding area on the second surface aligned with the contact area on the first surface, and wherein a remaining area of the second surface away from the corresponding area is in thermal contact with the thermal attachment.

* * * * *